US010696782B2

(12) United States Patent
Son et al.

(10) Patent No.: US 10,696,782 B2
(45) Date of Patent: Jun. 30, 2020

(54) PHOTOSENSITIVE RESIN COMPOSITION, CURED PRODUCT THEREOF, AND OPTICAL COMPONENT

(71) Applicant: DAICEL CORPORATION, Osaka-shi, Osaka (JP)

(72) Inventors: Tamaki Son, Himeji (JP); Takashi Kubo, Himeji (JP); Takahiro Iwahama, Himeji (JP)

(73) Assignee: DAICEL CORPORATION, Osaka-Shi (JP)

(*) Notice: Subject to any disclaimer, the term of this patent is extended or adjusted under 35 U.S.C. 154(b) by 0 days.

(21) Appl. No.: 14/385,056

(22) PCT Filed: Mar. 12, 2013

(86) PCT No.: PCT/JP2013/056738
§ 371 (c)(1),
(2) Date: Sep. 12, 2014

(87) PCT Pub. No.: WO2013/137227
PCT Pub. Date: Sep. 19, 2013

(65) Prior Publication Data
US 2015/0018447 A1    Jan. 15, 2015

(30) Foreign Application Priority Data

Mar. 13, 2012 (JP) .................................. 2012-056353
Dec. 18, 2012 (JP) .................................. 2012-276096
Mar. 1, 2013 (JP) .................................. 2013-041259

(51) Int. Cl.
C08G 59/24       (2006.01)
C08K 3/04        (2006.01)
C08G 65/08       (2006.01)
C08G 59/68       (2006.01)
G03F 7/038       (2006.01)
G03F 7/004       (2006.01)
C08G 59/32       (2006.01)
C08G 59/22       (2006.01)
C08L 47/00       (2006.01)
C08L 67/00       (2006.01)
C08L 69/00       (2006.01)
G02B 1/04        (2006.01)

(52) U.S. Cl.
CPC ............. C08G 59/24 (2013.01); C08G 59/22 (2013.01); C08G 59/32 (2013.01); C08G 59/68 (2013.01); C08G 59/687 (2013.01); C08G 59/688 (2013.01); C08K 3/04 (2013.01); C08L 47/00 (2013.01); C08L 67/00 (2013.01); C08L 69/00 (2013.01); G02B 1/04 (2013.01); G03F 7/0045 (2013.01); G03F 7/0046 (2013.01); G03F 7/038 (2013.01)

(58) Field of Classification Search
CPC ...... C08G 59/24; C08G 59/688; C08G 65/08; G03F 7/0045; G03F 7/0046; G03F 7/038; C08L 63/00; C08L 69/00; C08L 67/00; C08L 47/00; G02B 1/04; C08K 3/04; C08F 2/50
See application file for complete search history.

(56) References Cited

U.S. PATENT DOCUMENTS

| 5,571,593 | A | * | 11/1996 | Arldt | B32B 7/04 174/167 |
| 6,162,889 | A | * | 12/2000 | Orikabe | C08G 18/10 525/124 |
| 6,350,792 | B1 | * | 2/2002 | Smetana | C08F 283/10 428/413 |
| 2003/0022958 | A1 | * | 1/2003 | Watanabe | G03F 7/038 522/168 |
| 2004/0067440 | A1 | * | 4/2004 | Minegishi | C08G 59/1494 430/280.1 |
| 2005/0266335 | A1 | * | 12/2005 | Johnson | G03F 7/038 430/280.1 |
| 2006/0009547 | A1 | | 1/2006 | Maeshima et al. | |
| 2009/0131547 | A1 | | 5/2009 | Maeshima et al. | |

(Continued)

FOREIGN PATENT DOCUMENTS

CN   1688561 A   10/2005
CN   101253454 A   8/2008
(Continued)

OTHER PUBLICATIONS

Nakatani et al., machine English translation of JP 06-041788, pub Feb. 15, 1994.*

(Continued)

Primary Examiner — Jessica M Roswell
(74) Attorney, Agent, or Firm — Birch, Stewart, Kolasch & Birch, LLP

(57) ABSTRACT

Provided is a photosensitive resin composition that is, after being applied to an adherend surface, rapidly cured by photoirradiation to form a cured product having excellent light-shielding ability and adhesiveness (preferably, further having excellent reflow heat resistance). The photosensitive resin composition includes components (A), (C), and (D) and preferably further includes a component (B) as follows:

(A) a cationically polymerizable compound at least including a compound containing an alicyclic epoxy group and devoid of ester bonds;

(B) a hydroxyl-containing compound having a molecular weight of 500 or more;

(C) a photo-cationic polymerization initiator; and (D) a light-shielding material.

12 Claims, No Drawings

(56) References Cited

U.S. PATENT DOCUMENTS

| | | |
|---|---|---|
| 2009/0274961 A1 | 11/2009 | Koseki et al. |
| 2011/0200810 A1 | 8/2011 | Kubota |
| 2012/0142806 A1 | 6/2012 | Motofuji et al. |
| 2012/0251829 A1 | 10/2012 | Xu et al. |
| 2012/0251841 A1 | 10/2012 | Southwell et al. |
| 2012/0259031 A1 | 10/2012 | Dake et al. |

FOREIGN PATENT DOCUMENTS

| | | | |
|---|---|---|---|
| JP | 11-140279 | * 5/1999 | ............ C08L 63/00 |
| JP | 11-327127 A | 11/1999 | |
| JP | 2003-73457 A | 3/2003 | |
| JP | 2003-238770 A | 8/2003 | |
| JP | 2006-99027 A | 4/2006 | |
| JP | 2007-238894 A | 9/2007 | |
| JP | 2007-262401 A | 10/2007 | |
| JP | 2007-302808 A | 11/2007 | |
| JP | 2011-186437 A | 9/2011 | |
| JP | 2011-195499 A | 10/2011 | |
| JP | 2011-221476 A | 11/2011 | |
| WO | WO 2011/075553 A1 | 6/2011 | |

OTHER PUBLICATIONS

International Search Report, issued in PCT/JP2013/056738, dated Jun. 18, 2013.

* cited by examiner

1

PHOTOSENSITIVE RESIN COMPOSITION, CURED PRODUCT THEREOF, AND OPTICAL COMPONENT

TECHNICAL FIELD

The present invention relates to: photosensitive resin compositions; cured products thereof; and optical components. More specifically, the present invention relates to a photosensitive resin composition and a cured product thereof, and an optical component including the cured product, where the photosensitive resin composition, when applied to an optical component such as a lens and irradiated with light, can form a light-shielding film or light-shielding layer capable of maintaining an excellent adhesive strength to the optical component even upon a reflow process. The present application claims priority on the basis of Japanese Patent Application No. 2012-056353 filed in Japan on Mar. 13, 2012, Japanese Patent Application No. 2012-276096 filed in Japan on Dec. 18, 2012, and Japanese Patent Application No. 2013-041259 filed in Japan on Mar. 1, 2013, the contents of which are incorporated herein by reference.

BACKGROUND ART

Portable electronic appliances such as cellular phones and smartphones are now growing in demand. Such electronic appliances each bear a compact and thin imaging unit. The imaging unit generally includes optical components such as a solid-state image sensing device (such as a CCD image sensor or CMOS image sensor) and lenses. Two or more lenses are used for higher resolution, and a light-shielding film is provided between the lenses so as to prevent ghosts and flares caused by undesired light from outside.

Patent Literature (PTL) 1 describes a light-shielding sealing agent that includes a light-shielding material; a curable resin having an unsaturated double bond, such as an epoxy (meth)acrylate or urethane (meth)acrylate; a polymerization initiator; and a thermal curing agent. Disadvantageously, however, the light-shielding material contained in the light-shielding sealing agent impedes ultraviolet irradiation to the inside of the curable resin. The sealing agent, upon curing by ultraviolet irradiation alone, is therefore cured at a low curing rate (is cured slowly) and requires, for example, a long-time heat treatment in addition to the ultraviolet irradiation. Thus, the light-shielding sealing agent requires an excessively long time to be cured.

PTL 2 describes a light-shielding film obtained by curing a light-shielding coating material, where the coating material includes a light-shielding material, an epoxy resin, and an amine curing agent. Unfortunately, however, the light-shielding coating material also fails to be cured rapidly by ultraviolet irradiation and requires an excessively long time to be cured, as with the technology described in PTL 1. Specifically, the light-shielding coating material requires an additional curing process typically of drying at room temperature for 60 minutes and further heating at 80° C. for 120 minutes. In addition, the light-shielding film is affixed to the lenses via an adhesive layer. The resulting assembly of components is, however, demanded to be thinned associated with size reduction and performance improvement of imaging units.

In addition, imaging units to be mounted in portable electronic appliances require reflow heat resistance for efficient mounting.

CITATION LIST

Patent Literature

PTL 1: Japanese Unexamined Patent Application Publication (JP-A) No. 2006-99027
PTL 2: JP-A No. 2011-186437

SUMMARY OF INVENTION

Technical Problem

Accordingly, an object of the present invention is to provide a photosensitive resin composition that can be rapidly cured by photoirradiation after being applied to an adherend surface and can form a cured product having excellent light-shielding ability and adhesiveness.

Another object of the present invention is to provide a photosensitive resin composition that can be rapidly cured by photoirradiation after being applied to an adherend surface and can form a cured product having excellent light-shielding ability, adhesiveness, and reflow heat resistance.

Yet another object of the present invention is to provide a cured product obtained by curing the photosensitive resin composition (cured product of the photosensitive resin composition); and an optical component including the cured product.

Solution to Problem

After intensive investigations to achieve the objects, the inventors have found a compound containing an alicyclic epoxy group and devoid of ester bonds, when used as a cationically polymerizable compound in a resin composition, offers better curability than that of a resin composition containing an epoxy compound having an ester bond.

The inventors have also found that a specific hydroxyl-containing compound, when used as a curable compound in combination with the cationically polymerizable compound in the resin composition, can help the resin composition to have still better curability and better adhesiveness (particularly adhesiveness to glass); that the resulting resin composition can impart flexibility to a cured product obtained therefrom and thereby allow the cured product to have good conformability to an adherend surface shape and to resist peeling off from the adherend surface even upon a reflow process.

In addition, the inventors have found that the resin composition, when further containing a specific photo-cationic polymerization initiator, can rapidly form a cured product by photoirradiation alone even when containing a light-shielding material. The present invention has been made based on these findings.

Specifically, the present invention provides, in an aspect, a photosensitive resin composition that includes components as follows:

(A) a cationically polymerizable compound at least including a compound containing an alicyclic epoxy group and devoid of ester bonds;
(C) a photo-cationic polymerization initiator; and
(D) a light-shielding material.

The photosensitive resin composition preferably further includes a component as follows:

(B) a hydroxyl-containing compound having a molecular weight of 500 or more.

The photosensitive resin composition preferably includes, as the component (A), a compound represented by Formula (a-1):

[Chem. 1]

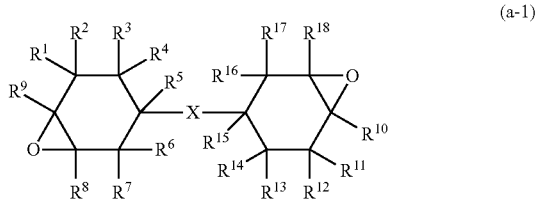

(a-1)

wherein $R^1$ to $R^{18}$ are identical or different and are independently selected from a hydrogen atom, a halogen atom, a hydrocarbon group optionally containing at least one of oxygen and halogen, and an optionally substituted alkoxy group; and X is selected from a single bond and a linkage group (excluding ester-bond-containing linkage groups).

The photosensitive resin composition preferably includes, as the component (B), a hydroxyl-containing compound containing a skeleton selected from polycarbonate, polyester, and polydiene skeletons.

The component (C) is preferably at least one of an iodonium salt compound and a sulfonium salt compound.

The component (C) is preferably a photo-cationic polymerization initiator including a cationic moiety; and an anionic moiety containing a fluoroalkyl group.

The anionic moiety of the component (C) is preferably a fluoroalkylfluorophosphate ion represented by the formula:

$$[(Rf)_n PF_{6-n}]^-$$

wherein Rf represents an alkyl group having 1 to 4 carbon atoms, except with fluorine replacing 80% or more of hydrogen of the alkyl group; and n represents an integer from 1 to 5.

The component (D) is preferably a carbon black.

The present invention provides, in another aspect, a cured product of the photosensitive resin composition.

In addition and advantageously, the present invention provides an optical component including the cured product.

Advantageous Effects of Invention

The photosensitive resin composition according to the present invention has the configuration, is thereby rapidly cured by photoirradiation after being applied to an adherend surface, and can form a cured product having excellent light-shielding ability and adhesiveness. The photosensitive resin composition according to the present invention, particularly when further including a hydroxyl-containing compound having a molecular weight of 500 or more, can be rapidly cured by photoirradiation after being applied to an adherend surface and can form a cured product having excellent light-shielding ability, adhesiveness, and reflow heat resistance. Assume that the photosensitive resin composition according to the present invention is used as an adhesive and applied to between two or more lenses forming an imaging unit of an electronic appliance. In this case, the photosensitive resin composition can rapidly bond and fix the lenses with each other by photoirradiation and can simultaneously form a light-shielding layer between the lenses. In addition, the photosensitive resin composition enables mounting of such a component typically onto a circuit board by solder reflow (reflow soldering). For these reasons, the photosensitive resin composition according to the present invention, when used to manufacture an electronic appliance, can shorten working processes and provide significantly better productivity. While a light-shielding film is applied to a lens via an adhesive layer according to customary techniques, the photosensitive resin composition according to the present invention can form a cured product acting both as a light-shielding film and as an adhesive layer and can thereby help an imaging unit to be further thinned.

DESCRIPTION OF EMBODIMENTS

The photosensitive resin composition according to the present invention includes components (A), (C), and (D) as essential components. The photosensitive resin composition according to the present invention preferably further includes a component (B):

(A) a cationically polymerizable compound at least including a compound containing an alicyclic epoxy group and devoid of ester bonds;

(B) a hydroxyl-containing compound having a molecular weight of 500 or more;

(C) a photo-cationic polymerization initiator; and (D) a light-shielding material.

Component (A)

The component (A) for use in the present invention is one of curable components (curable compounds) contained the photosensitive resin composition and includes one or more cationically polymerizable compounds including a compound containing at least one alicyclic epoxy group per one molecule and devoid of ester bonds. This compound is hereinafter also referred to as an "alicyclic epoxy compound". As used herein the term "alicyclic epoxy group" refers to a group formed by one oxygen atom and adjacent two carbon atoms constituting an alicycle. Such alicyclic epoxy compounds have excellent curability.

The alicyclic epoxy group is exemplified by an epoxy group formed by an oxygen atom and adjacent two carbon atoms constituting a cyclohexane ring.

The alicyclic epoxy compound may have one or more (e.g., one to six) alicyclic epoxy groups and has preferably two to five alicyclic epoxy groups, and particularly preferably two alicyclic epoxy groups, per molecule.

The alicyclic epoxy compound is exemplified by compounds represented by Formula (a-1) below. In Formula (a-1), $R^1$ to $R^{18}$ are identical or different and are independently selected from a hydrogen atom, a halogen atom, a hydrocarbon group optionally containing at least one of oxygen and halogen, and an optionally substituted alkoxy group; and X represents a single bond or a linkage group (excluding ester-bond-containing linkage groups).

[Chem. 2]

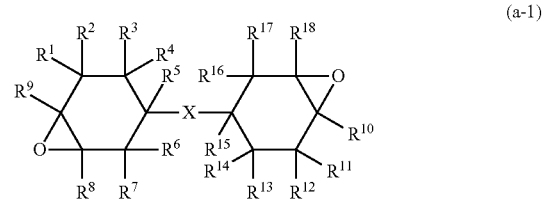

(a-1)

The halogen atom as $R^1$ to $R^{18}$ is exemplified by fluorine, chlorine, bromine, and iodine atoms.

The hydrocarbon group as $R^1$ to $R^{18}$ is exemplified by aliphatic hydrocarbon groups (e.g., alkyl groups, alkenyl groups, and alkynyl groups), alicyclic hydrocarbon groups, aromatic hydrocarbon groups, and groups each including two or more of them bonded to each other.

The alkyl groups are exemplified by $C_1$-$C_{20}$ alkyl groups such as methyl, ethyl, propyl, isopropyl, butyl, hexyl, octyl, isooctyl, decyl, and dodecyl groups, of which $C_1$-$C_{10}$ alkyl groups are preferred, and $C_1$-$C_4$ alkyl groups are particularly preferred. The alkenyl groups are exemplified by $C_2$-$C_{20}$ alkenyl groups such as vinyl, allyl, methallyl, 1-propenyl, isopropenyl, 1-butenyl, 2-butenyl, 3-butenyl, 1-pentenyl, 2-pentenyl, 3-pentenyl, 4-pentenyl, and 5-hexenyl groups, of which $C_2$-$C_{10}$ alkenyl groups are preferred, and $C_2$-$C_4$ alkenyl groups are particularly preferred. The alkynyl groups are exemplified by $C_2$-$C_{20}$ alkynyl groups such as ethynyl and propynyl groups, of which $C_2$-$C_{10}$ alkynyl groups are preferred, and $C_2$-$C_4$ alkynyl groups are particularly preferred.

The alicyclic hydrocarbon groups are exemplified by $C_3$-$C_{12}$ cycloalkyl groups such as cyclopropyl, cyclobutyl, cyclopentyl, cyclohexyl, and cyclododecyl groups; $C_3$-$C_{12}$ cycloalkenyl groups such as cyclohexenyl group; and $C_4$-$C_{15}$ bridged hydrocarbon groups such as bicycloheptyl and bicycloheptenyl groups.

The aromatic hydrocarbon groups are exemplified by $C_6$-$C_{12}$ aryl groups such as phenyl and naphthyl groups, of which $C_6$-$C_{10}$ aryl groups are preferred.

Of the groups each including two or more groups selected from the aliphatic hydrocarbon groups, alicyclic hydrocarbon groups, and aromatic hydrocarbon groups bonded to each other, groups including an aliphatic hydrocarbon group and an alicyclic hydrocarbon group bonded to each other are exemplified by $C_3$-$C_{12}$ cycloalkyl-$C_1$-$C_{20}$ alkyl groups such as cyclohexylmethyl group; and $C_1$-$C_{20}$ alkyl-$C_3$-$C_{12}$ cycloalkyl groups such as methylcyclohexyl group. Groups including an aliphatic hydrocarbon group and an aromatic hydrocarbon group bonded to each other are exemplified by $C_7$-$C_{18}$ aralkyl groups such as benzyl group and phenethyl group, of which $C_7$-$C_{10}$ aralkyl groups are preferred; $C_6$-$C_{14}$ aryl-$C_2$-$C_{20}$ alkenyl groups such as cinnamyl group; $C_1$-$C_{20}$ alkyl-substituted $C_6$-$C_{14}$ aryl groups such as tolyl group; and $C_2$-$C_{20}$ alkenyl-substituted $C_6$-$C_{14}$ aryl groups such as styryl group.

The hydrocarbon group optionally containing at least one of oxygen and halogen as $R^1$ to $R^{18}$ is exemplified by groups corresponding to the hydrocarbon groups, except with at least one hydrogen atom thereof being substituted with an-oxygen-containing group or a halogen-containing group. The oxygen-containing group is exemplified by hydroxyl group; hydroperoxy group; $C_1$-$C_{10}$ alkoxy groups such as methoxy, ethoxy, propoxy, isopropyloxy, butoxy, and isobutyloxy groups; $C_2$-$C_{10}$ alkenyloxy groups such as allyloxy group; $C_6$-$C_{14}$ aryloxy groups (e.g., tolyloxy and naphthyloxy groups) which may have one or more substituents selected from $C_1$-$C_{10}$ alkyl, $C_2$-$C_{10}$ alkenyl, halogen, and $C_1$-$C_{10}$ alkoxy; $C_7$-$C_{18}$ aralkyloxy groups such as benzyloxy and phenethyloxy groups; $C_1$-$C_{10}$ acyloxy groups such as acetyloxy, propionyloxy, (meth)acryloyloxy, and benzoyloxy groups; $C_1$-$C_{10}$ alkoxycarbonyl groups such as methoxycarbonyl, ethoxycarbonyl, propoxycarbonyl, and butoxycarbonyl groups; $C_6$-$C_{14}$ aryloxycarbonyl groups (e.g., phenoxycarbonyl, tolyloxycarbonyl, and naphthyloxycarbonyl groups) which may have one more substituents selected from $C_1$-$C_{10}$ alkyl, $C_2$-$C_{10}$ alkenyl, halogen, and $C_1$-$C_{10}$ alkoxy; $C_7$-$C_{18}$ aralkyloxy-carbonyl groups such as benzyloxycarbonyl group; epoxy-containing groups such as glycidyloxy group; oxetanyl-containing groups such as ethyloxetanyloxy group; $C_1$-$C_{10}$ acyl groups such as acetyl, propionyl, and benzoyl groups; isocyanato group; sulfo group; carbamoyl group; oxo group; and groups each including two or more of them bonded to each other with or without the medium typically of $C_1$-$C_{10}$ alkylene. The halogen-containing group is exemplified by fluorine, chlorine, bromine, and iodine atoms.

The alkoxy group as $R^1$ to $R^{18}$ is exemplified by $C_1$-$C_{10}$ alkoxy groups such as methoxy, ethoxy, propoxy, isopropyloxy, butoxy, and isobutyloxy groups.

The substituents which the alkoxy group may have are exemplified by halogen atoms, hydroxyl, $C_1$-$C_{10}$ alkoxy, $C_2$-$C_{10}$ alkenyloxy, $C_6$-$C_{14}$ aryloxy, $C_1$-$C_{10}$ acyloxy, mercapto, $C_1$-$C_{10}$ alkylthio, $C_2$-$C_{10}$ alkenylthio, $C_6$-$C_{14}$ arylthio, $C_7$-$C_{18}$ aralkylthio, carboxy, $C_1$-$C_{10}$ alkoxycarbonyl, $C_6$-$C_{14}$ aryloxycarbonyl, $C_7$-$C_{18}$ aralkyloxy-carbonyl, amino, mono- or di-($C_1$-$C_{10}$ alkyl)amino, $C_1$-$C_{10}$ acylamino, epoxy-containing groups, oxetanyl-containing groups, $C_1$-$C_{10}$ acyl, and oxo groups, and groups each including two or more of them bonded to each other with or without the medium typically of $C_1$-$C_{10}$ alkylene.

Among them, hydrogen atoms are preferred as $R^1$ to $R^{18}$.

X in Formula (a-1) represents a single bond or a linkage group (a divalent group having one or more atoms). However, a group containing an ester bond is excluded from the linkage group. The linkage group is exemplified by divalent hydrocarbon groups, carbonyl group, ether bond, amido group, and groups including two or more of them linked to each other. The divalent hydrocarbon groups are exemplified by linear or branched $C_1$-$C_{18}$ alkylene groups such as methylene, methylmethylene, dimethylmethylene, ethylene, propylene, and trimethylene groups; and divalent $C_3$-$C_{12}$ cycloalkylene and divalent $C_3$-$C_{12}$ cycloalkylidene groups, such as 1,2-cyclopentylene, 1,3-cyclopentylene, cyclopentylidene, 1,2-cyclohexylene, 1,3-cyclohexylene, 1,4-cyclohexylene, and cyclohexylidene groups.

Of the compounds represented by Formula (a-1), particularly preferred is (3,3',4,4'-diepoxy)bicyclohexyl, because this compound has small steric hindrance and allows a curing reaction to proceed rapidly by photoirradiation.

The alicyclic epoxy compound is further exemplified by compounds represented by Formulae (a-2) and (a-3):

[Chem. 3]

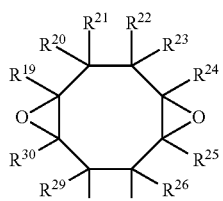

(a-2)

[Chem. 4]

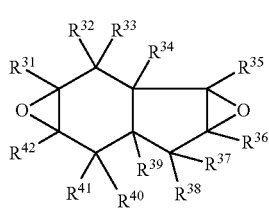

(a-3)

In Formula (a-2), $R^{19}$ to $R^{30}$ are independently selected from a hydrogen atom, a halogen atom, a hydrocarbon group optionally containing at least one of oxygen and halogen, and an optionally substituted alkoxy group. $R^{19}$ to $R^{30}$ may be identical or different. $R^{19}$ to $R^{30}$ are specifically exemplified as with $R^1$ to $R^{18}$ in Formula (a-1). Among them, preferably at least part of, and particularly preferably all of $R^{19}$ to $R^{30}$ are hydrogen atoms.

In Formula (a-3), $R^{31}$ to $R^{42}$ are independently selected from a hydrogen atom, a halogen atom, a hydrocarbon group optionally containing at least one of oxygen and halogen, and an optionally substituted alkoxy group. $R^{31}$ to $R^{42}$ may be identical or different. $R^{31}$ to $R^{42}$ are specifically exemplified as with $R^1$ to $R^{18}$ in Formula (a-1). Among them, preferably at least part of, and particularly preferably all of $R^{31}$ to $R^{42}$ are hydrogen atoms.

Any of the compounds represented by Formula (a-1) is preferred as the alicyclic epoxy compound.

The alicyclic epoxy compound can be produced typically by preparing a corresponding olefinic compound as an olefinic compound having a carbon-carbon unsaturated double bond in the same number as with the alicyclic epoxy group of the alicyclic epoxy compound; and epoxidizing the carbon-carbon unsaturated double bond(s) of the olefinic compound. An epoxidation reaction can be performed according to a known or customary procedure. The alicyclic epoxy compound may also be any of commercially available alicyclic epoxy compounds.

Typically, a compound represented by Formula (a-1) can be produced by epoxidizing an olefin represented by Formula (a-1'). $R^1$ to $R^{18}$ and X in Formula (a-1') are as with those in Formula (a-1).

[Chem. 5]

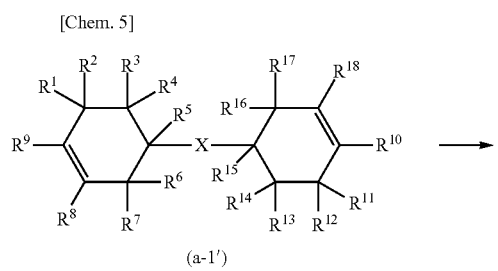

A compound represented by Formula (a-2) can be produced typically by preparing an olefin represented by Formula (a-2') as an unsaturated compound having a cyclooctadiene skeleton; and oxidizing (epoxidizing) the olefin. $R^{19}$ to $R^{30}$ in Formula (a-2') are as with those in Formula (a-2).

[Chem. 6]

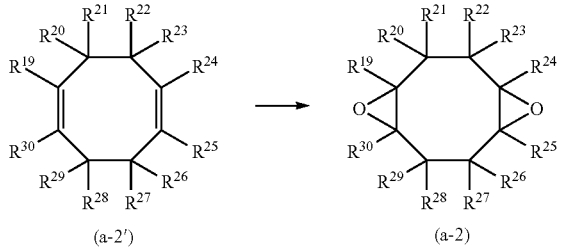

Likewise, a compound represented by Formula (a-3) can be produced typically by preparing an olefin represented by Formula (a-3') as an unsaturated compound having a tetrahydroindene skeleton; and oxidizing (epoxidizing) the olefin. $R^{31}$ to $R^{42}$ in Formula (a-3') are as with those in Formula (a-3).

[Chem. 7]

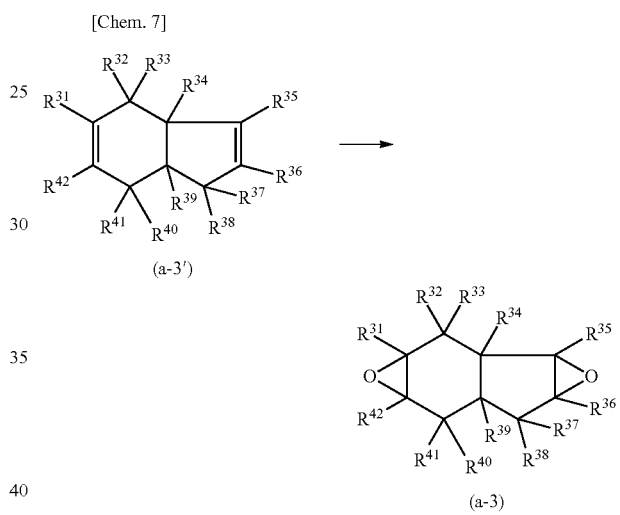

An epoxidizing agent usable in the epoxidation reaction is exemplified by known or customary oxidizing agents such as organic peroxycarboxylic acids and hydroperoxides. The organic peroxycarboxylic acids are exemplified by performic acid, peracetic acid, perpropionic acid, perbenzoic acid, trifluoroperacetic acid, and perphthalic acid. The hydroperoxides are exemplified by hydrogen peroxide, tert-butyl hydroperoxide, and cumene hydroperoxide.

Each of different alicyclic epoxy compounds may be used alone or in combination in the component (A).

The component (A) may further include one or more other cationically polymerizable compounds in addition to the alicyclic epoxy compound(s). Such other cationically polymerizable compounds are exemplified by epoxy compounds other than the alicyclic epoxy compounds; compounds having one or more oxetanyl groups per molecule; and compounds having one or more vinyl ether groups per molecule. Each of them may be used alone or in combination.

The epoxy compounds other than the alicyclic epoxy compounds are exemplified by epoxy compounds having an alicyclic structure in a molecule; aromatic glycidyl ether epoxy compounds such as bisphenol-A epoxy compounds and bisphenol-F epoxy compounds; aliphatic glycidyl ether epoxy compounds such as mono- or poly-glycidyl ethers of aliphatic polyhydric alcohols; glycidyl ester epoxy compounds; and glycidylamine epoxy compounds.

The epoxy compounds having an alicyclic structure in a molecule include (i) compounds having an epoxy group directly bonded to an alicycle via a single bond, such as compounds represented by Formula (a-4) below; (ii) hydrogenated aromatic glycidyl ether epoxy compounds obtained by hydrogenating corresponding aromatic glycidyl ether epoxy compounds; and (iii) compounds containing an alicyclic epoxy group and an ester bond.

[Chem. 8]

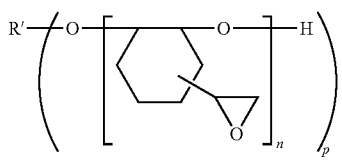
(a-4)

In Formula (a-4), R' represents a group corresponding to a p-hydric alcohol, except for removing —OH in the number of p therefrom; and p and n each represent a natural number. The numbers p and n are preferably from 1 to 6 and from 1 to 30, respectively. The p-hydric alcohol [R'—(OH)$_p$] is exemplified by $C_1$-$C_{15}$ polyhydric alcohols such as 2,2-bis(hydroxymethyl)-1-butanol. When p is 2 or more, the number "n" in the brackets in p occurrences may be identical or different. Preferred examples of the compounds represented by Formula (a-4) include 1,2-epoxy-4-(2-oxiranyl)cyclohexane adduct of 2,2-bis(hydroxymethyl)-1-butanol, such as a product under the trade name of EHPE3150 (Daicel Corporation).

The hydrogenated aromatic glycidyl ether epoxy compounds (ii) obtained by hydrogenating aromatic glycidyl ether epoxy compounds are exemplified by hydrogenated aromatic glycidyl ether epoxy compounds obtained by hydrogenating aromatic glycidyl ether epoxy compounds. The hydrogenated aromatic glycidyl ether epoxy compounds are exemplified by hydrogenated bisphenol-A epoxy compounds as compounds obtained by hydrogenating bisphenol-A epoxy compounds, such as 2,2-bis[4-(2,3-epoxypropoxy)cyclohexyl]propane and 2,2-bis[3,5-dimethyl-4-(2,3-epoxypropoxy)cyclohexyl]propane; hydrogenated bisphenol-F epoxy compounds as compounds obtained by hydrogenating bisphenol-F epoxy compounds, such as bis[o,o-(2,3-epoxypropoxy)cyclohexyl]methane, bis[o,p-(2,3-epoxypropoxy)cyclohexyl]methane, bis[p,p-(2,3-epoxypropoxy)cyclohexyl]methane, and bis[3,5-dimethyl-4-(2,3-epoxypropoxy)cyclohexyl]methane; hydrogenated biphenol epoxy compounds; hydrogenated phenol-novolac epoxy compounds; hydrogenated cresol-novolac epoxy compounds; hydrogenated cresol-novolac epoxy compounds derived from bisphenol-A; hydrogenated naphthalene epoxy compounds; and hydrogenated epoxy compounds obtained by hydrogenating epoxy compounds derived from trisphenolmethane. Among them, epoxy compounds obtained by hydrogenating bisphenol-A epoxy compounds are particularly preferred. The hydrogenated aromatic glycidyl ether epoxy compounds are also available as commercial products typically under the trade name of YX8000 (Mitsubishi Chemical Corporation).

The compounds (iii) containing an alicyclic epoxy group and an ester bond are specifically exemplified by compounds represented by Formula (a-5):

[Chem. 9]

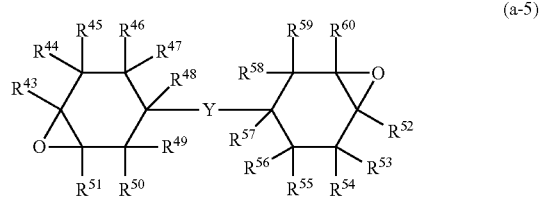
(a-5)

In Formula (a-5), $R^{43}$ to $R^{60}$ are independently selected from a hydrogen atom, a halogen atom, a hydrocarbon group optionally containing at least one of oxygen and halogen, and an optionally substituted alkoxy group. $R^{43}$ to $R^{60}$ may be identical or different. Examples of $R^{43}$ to $R^{60}$ are as with $R^1$ to $R^{18}$ in Formula (a-1). Among them, preferably at least part of, and particularly preferably all of $R^{43}$ to $R^{60}$ are hydrogen atoms.

Y in Formula (a-5) represents a linkage group (divalent group containing at least one atom) containing an ester bond. The linkage group containing an ester bond is exemplified by ester group (ester bond itself); and groups (divalent groups including an ester bond) each including one or more linkage groups linked via one or more ester bonds, where the linkage groups (divalent groups each containing at least one atom) are exemplified by divalent hydrocarbon groups, carbonyl group, ether bond, amido group, and groups each including two or more of them linked to each other.

The compounds represented by Formula (a-5) are specifically exemplified by compounds represented by Formula (a-5-1) to (a-5-7) as follows. In Formula (a-5-4), m represents an integer from 1 to 30. In Formulae (a-5-6) and (a-5-7), n1 to n6 each represent an integer from 1 to 30.

[Chem. 10]

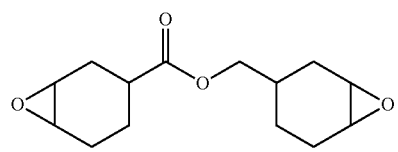
(a-5-1)

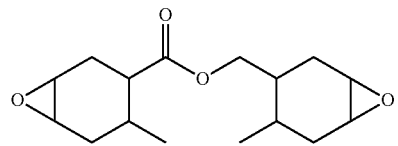
(a-5-2)

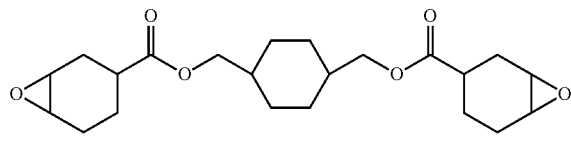
(a-5-3)

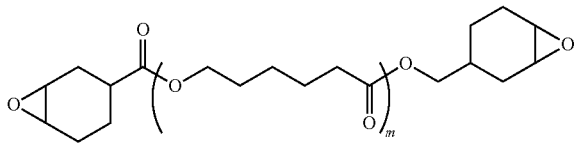
(a-5-4)

-continued (a-5-5)

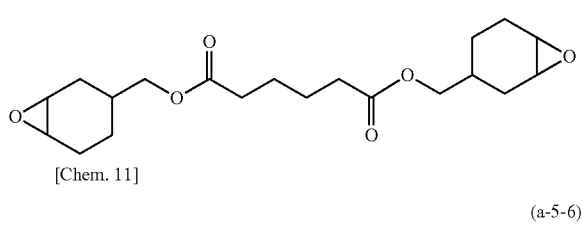

[Chem. 11]

(a-5-6)

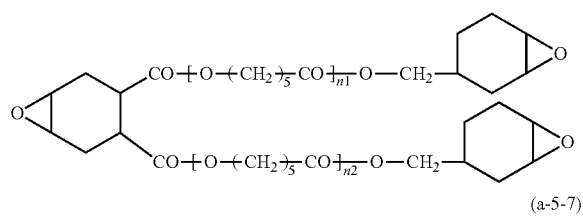

(a-5-7)

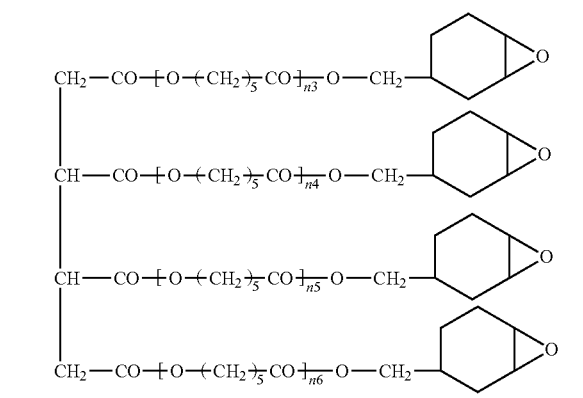

Of the epoxy compounds other than the alicyclic epoxy compounds, preferred are epoxy compounds each having one or more alicyclic structures per molecule and devoid of aromatic ring structures and ester bonds. This is because these epoxy compounds offer excellent curability and can give a cured product having excellent heat resistance, light resistance (lightfastness), and water proofness. An epoxy compound containing one or more ester bonds per molecule, when used as an epoxy compound other than the alicyclic epoxy compounds, may be used in a content of preferably 40 percent by weight or less, more preferably 30 percent by weight or less, particularly preferably less than 10 percent by weight, and most preferably less than 5 percent by weight, based on the total amount (100 percent by weight) of the component (A). The epoxy compound containing one or more ester bonds per molecule, if used in a content greater than the range, may cause the resin composition to have inferior curability and to a cured product having insufficient heat resistance. Such an epoxy compound containing one or more ester bonds per molecule is susceptible to hydrolysis and may often give a cured product having insufficient water proofness.

The compound(s) (iii) containing an alicyclic epoxy group and an ester bond may be used in a content (amount) not critical, but preferably 12 percent by weight or less (e.g., 0 to 12 percent by weight), more preferably 8 percent by weight or less, furthermore preferably 5 percent by weight or less, and particularly preferably 3 percent by weight or less, based on the total amount (100 percent by weight) of the component (A). The compound(s) (iii), if used in a content greater than 12 percent by weight, may cause the photosensitive resin composition to offer insufficient curability in some shapes and thicknesses of the cured product to be formed.

In an embodiment, the photosensitive resin composition according to the present invention includes the compound(s) (iii) containing an alicyclic epoxy group and an ester bond. Particularly in this embodiment, the content (part by weight) of the alicyclic epoxy compound(s) is preferably greater than the content (part by weight) of the compound(s) (iii), namely, the two contents preferably meet the expression:

[Content of alicyclic epoxy compound(s)]>[Content of compound(s) (iii) containing an alicyclic epoxy group and an ester bond]

Specifically, the difference between the content of the alicyclic epoxy compound(s) and the content of the compound(s) (iii) containing an alicyclic epoxy group and an ester bond ([Content (part by weight) of alicyclic epoxy compound(s)]-[Content (part by weight) of compound(s) (iii) containing an alicyclic epoxy group and an ester bond] is preferably greater than 0 part by weight, more preferably 5 parts by weight or more, and furthermore preferably 10 parts by weight or more. The photosensitive resin composition, if having a difference in contents of 0 part by weight or less, may have inferior curability and may readily undergo curing failure.

The compounds having one or more oxetanyl groups per molecule are exemplified by 3,3-bis(vinyloxymethyl)oxetane, 3-ethyl-3-hydroxymethyloxetane, 3-ethyl-3-(2-ethylhexyloxymethyl)oxetane, 3-ethyl-3-(hydroxymethyl)oxetane, 3-ethyl-3-[(phenoxy)methyl]oxetane, 3-ethyl-3-(hexyloxymethyl)oxetane, 3-ethyl-3-(chloromethyl)oxetane, 3,3-bis(chloromethyl)oxetane, 1,4-bis[(3-ethyl-3-oxetanylmethoxy)methyl]benzene, bis([1-ethyl (3-oxetanyl)]methyl) ether, 4,4'-bis[(3-ethyl-3-oxetanyl)methoxymethyl]bicyclohexyl, 1,4-bis[(3-ethyl-3-oxetanyl)methoxymethyl]cyclohexane, 1,4-bis([(3-ethyl-3-oxetanyl)methoxy]methyl)benzene, 3-ethyl-3[[(3-ethyloxetan-3-yl)methoxy]methyl)oxetane, and xylylene bisoxetane. The compounds for use herein are also available as commercial products typically under the trade names of OXT221 and OXT121 (each from Toagosei Co., Ltd.).

The compounds having one or more vinyl ether groups per molecule are exemplified by 2-hydroxyethyl vinyl ether, 3-hydroxypropyl vinyl ether, 2-hydroxypropyl vinyl ether, 2-hydroxyisopropyl vinyl ether, 4-hydroxybutyl vinyl ether, 3-hydroxybutyl vinyl ether, 2-hydroxybutyl vinyl ether, 3-hydroxyisobutyl vinyl ether, 2-hydroxyisobutyl vinyl ether, 1-methyl-3-hydroxypropyl vinyl ether, 1-methyl-2-hydroxypropyl vinyl ether, 1-hydroxymethylpropyl vinyl ether, 4-hydroxycyclohexyl vinyl ether, 1,6-hexanediol mono- or di-vinyl ether, 1,4-cyclohexanedimethanol mono- or di-vinyl ether, 1,3-cyclohexanedimethanol mono- or di-vinyl ether, 1,2-cyclohexanedimethanol mono- or di-vinyl ether, p-xylene glycol mono- or di-vinyl ether, m-xylene glycol mono- or di-vinyl ether, o-xylene glycol mono- or di-vinyl ether, diethylene glycol mono- or di-vinyl ether, triethylene glycol mono- or di-vinyl ether, tetraethylene glycol mono- or di-vinyl ether, pentaethylene glycol mono- or di-vinyl ether, oligoethylene glycol mono- or di-vinyl ethers, polyethylene glycol mono- or di-vinyl ethers, dipropylene glycol mono- or di-vinyl ether, tripropylene glycol mono- or di-vinyl ether, tetrapropylene glycol mono- or di-vinyl ether, pentapropylene glycol mono- or di-vinyl ether, oligopropylene glycol mono- or di-vinyl ethers, polypropylene glycol mono- or di-vinyl ethers, and derivatives of them.

The photosensitive resin composition herein particularly preferably further includes, as the component (A), a compound having one or more oxetanyl groups per molecule in combination with the alicyclic epoxy compound(s) for a higher initial adhesive strength.

The photosensitive resin composition according to the present invention may include the component (A) in a content not critical, but preferably 20 to 99 percent by weight, and more preferably 25 to 98 percent by weight, based on the total amount (100 percent by weight) of the photosensitive resin composition. In an embodiment, the photosensitive resin composition according to the present invention further includes the component (B). The photosensitive resin composition in this embodiment may contain the component (A) in a content of typically about 20 to about 90 percent by weight, preferably 25 to 80 percent by weight, and particularly preferably 30 to 70 percent by weight, based on the total amount (100 percent by weight) of the photosensitive resin composition. The photosensitive resin composition, if including the component (A) in a content less than the range, may often offer insufficient curability and cause curing failure. In contrast, the photosensitive resin composition, if including the component (A) in a content greater than the range, may give a cured product that may readily have poor flexibility and be peeled off during a reflow process. In another embodiment, the photosensitive resin composition according to the present invention is devoid of the component (B). The photosensitive resin composition in this embodiment may contain curable compound(s) in a total content (amount) not critical, but preferably 75 to 99 percent by weight, and more preferably 80 to 98 percent by weight, based on the total amount (100 percent by weight) of the photosensitive resin composition. The photosensitive resin composition, if containing the curable compound(s) in a total content of less than 75 percent by weight, may give a cured product being insufficient in properties such as adhesiveness. In contrast, the photosensitive resin composition, if containing the curable compound(s) in a content greater than 99 percent by weight, may give a cured product that fails to exhibit sufficient light-shielding ability, because of a relatively smaller content of the component (D).

The photosensitive resin composition may contain, as the component (A), the alicyclic epoxy compound(s) in a content of typically about 20 to about 90 percent by weight, preferably 25 to 85 percent by weight, particularly preferably 30 to 80 percent by weight, and furthermore preferably 30 to 70 percent by weight, based on the total amount (100 percent by weight) of the component (A). The term "content" refers to a "total content" when two or more alicyclic epoxy compounds are employed. The photosensitive resin composition, if containing the alicyclic epoxy compound(s) in a content less than the range, may readily have insufficient curability and suffer from curing failure. In contrast, the photosensitive resin composition, if containing the alicyclic epoxy compound(s) in a content greater than the range, may readily give a cured product having poor flexibility and being peeled off during a reflow process.

The photosensitive resin composition may contain, as the component (A), the other cationically polymerizable compound(s) in a content of typically about 10 to about 80 percent by weight, preferably 15 to 75 percent by weight, particularly preferably 20 to 70 percent by weight, and most preferably 30 to 70 percent by weight, based on the total amount (100 percent by weight) of the component (A). The term "content" refers to a "total content" when two or more other cationically polymerizable compounds are employed.

The photosensitive resin composition, when containing the other cationically polymerizable compound(s) (particularly compound(s) having one or more oxetanyl groups per molecule) in a content within the range, can offer a higher initial curing rate to form a cured product with excellent curability. In contrast, the photosensitive resin composition, if containing the other cationically polymerizable compound(s) in an excessively high content, may readily give a cured product having a low strength and insufficient impact resistance.

Component (B)

The component (B) for use herein is one of curable components in the photosensitive resin composition and includes a hydroxyl-containing compound having a molecular weight of 500 or more (excluding compounds belonging to the component (A)). The hydroxyl-containing compound preferably contains two or more, and particularly preferably two, hydroxyl groups per molecule (per one molecule). The component (B) for use herein functionally helps the photosensitive resin composition to be cured more readily and to have better adhesiveness typically to glass, imparts flexibility to the resulting cured product, and thereby helps the cured product to conform satisfactorily to an adherend surface shape and to have better adhesiveness to the adherend.

The component (B) has a molecular weight of 500 or more, preferably 500 to 100000, particularly preferably 1000 to 80000, and most preferably 1500 to 50000. The component (B), if having a molecular weight less than the range, may often less effectively impart flexibility to the cured product. In contrast, the component (B), if having a molecular weight greater than the range, may readily cause the composition to have a higher viscosity and to offer inferior workability. The component (B) has a number-average molecular weight of preferably 500 or more, more preferably 500 to 100000, particularly preferably 1000 to 80000, and most preferably 1500 to 50000. The component (B), if having a number-average molecular weight less than the range, may often less effectively impart flexibility to the cured product. In contrast, the component (B), if having a number-average molecular weight greater than the range, may readily cause the composition to have a higher viscosity and to offer inferior workability.

The hydroxyl-containing compound in the component (B) is exemplified by hydroxyl-containing compounds having a polycarbonate skeleton in the molecule; hydroxyl-containing compounds having a polyester skeleton in the molecule; and hydroxyl-containing compounds having a polydiene skeleton in the molecule. Each of them may be used alone or in combination.

Each of such hydroxyl-containing compounds having a polycarbonate skeleton in the molecule may be synthesized typically by a phosgene method; or transesterification between a polyol and a dialkyl carbonate or diphenyl carbonate, where the dialkyl carbonate is exemplified by dimethyl carbonate or diethyl carbonate (see JP-A No. S62-187725, JP-A No. H02-175721, JP-A No. H02-49025, JP-A No. H03-220233, and JP-A No. H03-252420).

The polyol for use in the transesterification is exemplified by 1,6-hexanediol, ethylene glycol, diethylene glycol, 1,3-propanediol, 1,4-butanediol, 1,3-butanediol, 2,3-butanediol, 1,5-pentanediol, 3-methyl-1,5-pentanediol, 1,4-cyclohexanedimethanol, 1,12-dodecanediol, polybutadienediols, neopentyl glycol, tetramethylene glycol, propylene glycol, dipropylene glycol, glycerol, trimethylolpropane, 1,3-dihydroxyacetone, hexylene glycol, 1,2,6-hexanetriol, ditrimethylolpropane, trimethylolethane, trimethyloloctane, and pentaerythritol. The polyol for use herein is also exemplified by "Glycol esters" (available from MITSUBISHI GAS CHEMICAL COMPANY, INC.), polyester polyols, and polyether polyols.

The hydroxyl-containing compounds having a polycarbonate skeleton in the molecule are available as commercial products typically under the trade names of PLACCEL CD205, PLACCEL CD205PL, PLACCEL CD205HL, PLACCEL D210, PLACCEL CD210PL, PLACCEL CD210HL, PLACCEL CD220, PLACCEL CD220PL, PLACCEL CD220HL, PLACCEL CD220EC, and PLACCEL CD221T (each from Daicel Corporation); and the trade names of UM-CARB90 (1/3), UM-CARB90 (1/1), and UC-CARB100 (each from Ube Industries, Ltd.).

Each of the hydroxyl-containing compounds having a polyester skeleton in the molecule can be synthesized by reacting a polyol with a carboxylic acid (e.g., a polycarboxylic acid or hydroxycarboxylic acid). Alternatively, each of the compounds can also be synthesized by ring-opening polymerization of a lactone.

The polyol acting as a raw material for the hydroxyl-containing compounds having a polyester skeleton in the molecule is exemplified as with the polyol for use in the transesterification.

The carboxylic acid acting as a raw material for the hydroxyl-containing compounds having a polyester skeleton in the molecule is exemplified by oxalic acid, adipic acid, sebacic acid, fumaric acid, malonic acid, succinic acid, glutaric acid, azelaic acid, citric acid, 2,6-naphthalenedicarboxylic acid, phthalic acid, isophthalic acid, terephthalic acid, citraconic acid, 1,10-decanedicarboxylic acid, methylhexahydrophthalic anhydride, hexahydrophthalic anhydride, methyltetrahydrophthalic anhydride, tetrahydrophthalic anhydride, pyromellitic anhydride, trimellitic anhydride, lactic acid, malic acid, glycolic acid, dimethylolpropionic acid, and dimethylolbutanoic acid.

The lactone is exemplified by ε-caprolactone, δ-valerolactone, and γ-butyrolactone.

The hydroxyl-containing compounds having a polyester skeleton in the molecule are available as commercial products such as PLACCEL 205U, PLACCEL L205AL, PLACCEL L208AL, PLACCEL L212AL, PLACCEL L220AL, PLACCEL L230AL, PLACCEL 220ED, PLACCEL 220EC, PLACCEL 220EB, PLACCEL 303, PLACCEL 305, PLACCEL 308, PLACCEL 312, PLACCEL L312AL, PLACCEL 320, PLACCEL L320AL, PLACCEL 320ML, PLACCEL 410, PLACCEL 410D, PLACCEL P3403, PLACCEL E227, PLACCEL DC2009, PLACCEL DC2016, and PLACCEL DC2209 (each from Daicel Corporation); and Kuraray Polyol P-510 (from Kuraray Co. Ltd.).

Of the hydroxyl-containing compounds having a polyester skeleton in the molecule, preferred to be used are hydroxyl-containing compounds obtained by ring-opening polymerization of a lactone, of which hydroxyl-containing compounds having a caprolactone skeleton are more preferred. These compounds are preferred for imparting flexibility to the cured product.

The hydroxyl-containing compounds having a polydiene skeleton in the molecule are exemplified by compounds having a molecular chain with a polybutadiene skeleton or polyisoprene skeleton, and hydroxyl groups at both terminals of the molecule chain; and compounds corresponding to the compounds having a molecular chain with a polybutadiene skeleton or polyisoprene skeleton, except with part of double bonds of the molecular chain being epoxidized.

The hydroxyl-containing compounds having a polydiene skeleton in the molecule are available as commercial products typically under the trade names of EPOLEAD PB3600 (from Daicel Corporation) and Poly ip (from Idemitsu Kosan Co., Ltd.).

Among them, the component (B) for use herein preferably includes both a hydroxyl-containing compound having a polycarbonate skeleton in the molecule and a hydroxyl-containing compound having a polydiene skeleton in the molecule in combination. This is preferred for imparting flexibility and toughness to the cured product.

The photosensitive resin composition according to the present invention may contain the component (B) in an amount (total amount when containing two or more compounds as the component (B)) of typically about 5 to about 80 percent by weight, preferably 10 to 70 percent by weight, and particularly preferably 15 to 60 percent by weight, based on the total amount (100 percent by weight) of curable components contained in the composition (i.e., the total amount of the components (A) and (B)). The photosensitive resin composition, if including the component (B) in an amount less than the range, may often give a cured product that has insufficient flexibility, thereby has insufficient adhesion to the adherend surface, and is liable to be peeled off upon a reflow process. In contact, the photosensitive resin composition, if including the component (B) in an amount greater than the range, may readily give a cured product that is inferior in impact resistance, transparency, heat resistance, and moisture resistance.

The ratio (in weight ratio) of the hydroxyl-containing compound having a polycarbonate skeleton in the molecule to the hydroxyl-containing compound having a polydiene skeleton in the molecule, when used in combination as the component (B), is typically about 1:99 to about 99:1.

Component (C)

The photo-cationic polymerization initiator in the component (C) for use herein is a compound that generates a cationic species by photoirradiation and initiates the curing reaction of cationically polymerizable compound(s) in the photosensitive resin composition. The photo-cationic polymerization initiator is composed of a cationic moiety that absorbs light; and an anionic moiety that acts as an acid source.

The photo-cationic polymerization initiator as the component (C) preferably employs at least one of an iodonium salt compound and a sulfonium salt compound (either one or both of an iodonium salt compound and a sulfonium salt compound). This is preferred because the photo-cationic polymerization initiator of this type can accelerate the curing of cationically polymerizable compound(s) by photoirradiation alone and helps the photosensitive resin composition to have excellent curability. Each of them may be used alone or in combination.

Of such iodonium salt compounds, aryliodonium salt compounds are preferred, and bisaryliodonium salt compounds are particularly preferred. Of sulfonium salt compounds, arylsulfonium salt compounds are preferred, and triarylsulfonium salt compounds are particularly preferred.

Accordingly, the cationic moiety of the photo-cationic polymerization initiator preferably includes an iodonium ion and/or sulfonium ion.

The iodonium ion is exemplified by aryliodonium ions such as diphenyliodonium, di-p-tolyliodonium, bis(4-dodecylphenyl)iodonium, bis(4-methoxyphenyl)iodonium, (4-octyloxyphenyl)phenyliodonium, bis(4-decyloxy)phenyliodonium, 4-(2-hydroxytetradecyloxyphenyl)phenyliodonium, 4-isopropylphenyl(p-tolyl) iodonium, and 4-isobutylphenyl(p-tolyl)iodonium ions, of which bisaryliodonium ions are particularly preferred.

The sulfonium ion is exemplified by arylsulfonium ions such as triphenylsulfonium, diphenyl[4-(phenylthio)phenyl] sulfonium, and tri-p-tolylsulfonium ions, of which triarylsulfonium ions are particularly preferred.

The anionic moiety of the photo-cationic polymerization initiator is exemplified by $BF_4^-$, $B(C_6F_5)_4^-$, $PF_6^-$, $[[(Rf)_nPF_{6-n}]^-$ (wherein Rf represents an alkyl group, except with fluorine replacing 80% or more of hydrogen of the alkyl group (preferably, $C_1$-$C_4$ alkyl, except with fluorine replacing 80% or more of hydrogen of the alkyl); and n represents an integer from 1 to 5), $AsF_6^-$, $SbF_6^-$, and pentafluorohydroxyantimonate. Among them, the anionic moiety for use herein is preferably an alkyl moiety containing a fluoroalkyl group (a group corresponding to an alkyl group, except with at least one hydrogen atom being substituted with a fluorine atom) are preferred, and is more preferably the fluoroalkylfluorophosphate ion represented by $[[(Rf)_nPF_{6-n}]^-$, for excellent safety and cationic polymerization activity.

In the formula $[[(Rf)_nPF_{6-n}]^-$, Rf is an alkyl group except with 80% or more of hydrogen atoms being substituted with fluorine atoms. Among such fluoroalkyl groups, preferred are linear or branched $C_1$-$C_4$ alkyl groups except with all of hydrogen atoms being substituted with fluorine atoms, such as $CF_3$, $C_2F_5$, $(CF_3)_2CF$, $C_3F_7$, $C_4F_9$, $(CF_3)_2CFCF_2$, $CF_3CF_2(CF_3)CF$, and $(CF_3)_3C$.

Accordingly, $[(C_2F_5)_3PF_3]^-$, $[(C_3F_7)_3PF_3]^-$, $[((CF_3)_2CF)_3PF_3]^-$, $[((CF_3)_2CF)_2PF_4]^-$, $[((CF_3)_2CFCF_2)_3PF_3]^-$, and $[((CF_3)_2CFCF_2)_2PF_4]^-$ are particularly preferred as the anionic moiety of the photo-cationic polymerization initiator.

The photo-cationic polymerization initiator for use herein is preferably selected typically from 4-isopropylphenyl(p-tolyl)iodonium tris(pentafluoroethyl)trifluorophosphate and [1,1'-biphenyl]-4-yl[4-(1,1'-biphenyl)-4-ylthiophenyl]phenyl tris(pentafluoroethyl)trifluorophosphate.

The photosensitive resin composition may include the component (C) in a content of typically about 0.1 to about 30 parts by weight, preferably 0.5 part by weight or more, more preferably 1 to 25 parts by weight, furthermore preferably 3 to 20 parts by weight, particularly preferably 3 to 15 parts by weight, and most preferably 3 to 10 parts by weight, per 100 parts by weight of the component (A). The photosensitive resin composition, if including the component (C) in a content less than the range, may readily offer insufficient curability. In contrast, the photosensitive resin composition, if including the component (C) in a content greater than the range, may readily offer insufficient storage stability.

The photosensitive resin composition according to the present invention may further include a sensitizer (photosensitizer) to be used for increasing the sensitivity of general photo-cationic polymerization initiators. The sensitizer for use herein may be any known or customary sensitizer, but is exemplified by amine compounds such as triethanolamine, methyldiethanolamine, triethylamine, and diethylamine; thioxanthone and derivatives thereof such as 2-chlorothioxanthone; anthraquinone and derivatives thereof; anthracene and derivatives thereof; perylene and derivatives thereof; pyrene and derivatives thereof; acridine and derivatives thereof such as acridine orange; benzophenone; benzoin isopropyl ether; and benzoflavin. Each of the sensitizers may be used alone or in combination. The photosensitive resin composition may include the sensitizer(s) in a content (amount) not critical, but preferably 10 parts by weight or less, and more preferably 3 parts by weight or less, per 100 parts by weight of the total amount of the component (A) in the photosensitive resin composition.

Component (D)

The component (D) for use herein is a light-shielding material that disperses in the photosensitive resin composition and the cured product thereof and imparts light-shielding ability to them. Typically, any of pigments and dyes is advantageously used herein as the component (D).

The pigments are exemplified by inorganic pigments, organic pigments, and pigments each including an inorganic pigment (e.g., a carbon black or black titanium oxide) having a surface coated with an organic material (e.g., a resin). The inorganic pigments are exemplified by black inorganic pigments such as carbon blacks, chromium oxide, iron oxide, black titanium oxide, acetylene black, lamp black, bone black, black lead (graphite), black synthetic oxide, black pigments containing copper and chromium, black pigments containing copper, iron, and manganese, black pigments containing cobalt, iron, and chromium, ruthenium oxide, graphite, metal microparticles, metal oxide microparticles, multi-component oxide microparticles, metal sulfide microparticles, and metal nitride microparticles. The organic pigments are exemplified by black organic pigments such as perylene black, cyanine black, and aniline black; and black-simulating mixed color organic pigments obtained by mixing two or more pigments typically of red, blue, green, purple, yellow, cyan, or magenta, such as azo, phthalocyanine, quinacridone, benzimidazolone, isoindolinone, dioxazine, Indanthrene, and perylene pigments. Each of them may be used alone or in combination.

The dyes are exemplified by azo, anthraquinone, phthalocyanine, quinonimine, quinoline, nitro, carbonyl, and methine dyes. Each of them may be used alone or in combination.

Among them, pigments are preferred, and carbon blacks are particularly preferred as the light-shielding material for use herein, for excellent dispersibility, light-shielding ability, and durability.

The light-shielding material has an average particle diameter of typically preferably about 5 to about 500 nm as determined by a dynamic light scattering measurement. The light-shielding material, if having an average particle diameter greater than the range, may readily offer insufficient light-shielding ability. In contrast, the light-shielding material, if having an average particle diameter less than the range, may become liable to aggregate and to fail to satisfactorily disperse.

The photosensitive resin composition may include the component (D) in an amount of typically about 0.5 to about 50 parts by weight, preferably 1 to 30 parts by weight, and particularly preferably 3 to 20 parts by weight, per 100 parts by weight of the curable components (i.e., the total amount of the components (A) and (B)). The photosensitive resin composition according to the present invention may include the component (D) in a content (amount) not critical, but preferably 0.5 to 20 percent by weight, more preferably 1.0 to 15 percent by weight, and furthermore preferably 1.5 to 10 percent by weight, based on the total amount (100 percent by weight) of the photosensitive resin composition. The photosensitive resin composition, if including the component (D) in a content less than the range, may often fail to enjoy sufficient light-shielding ability. In contrast, the photosensitive resin composition, if including the component (D) in a content greater than the range, may readily have a higher viscosity and inferior workability.

Thermal Initiator

The photosensitive resin composition according to the present invention may further include a thermal initiator (thermal polymerization initiator) as a polymerization initiator in addition to the component (C) (photo-cationic polymerization initiator). The thermal initiator for use herein may be any of known or customary thermal initiators. Such thermal initiators are compounds that can initiate a polymerization reaction of a cationically polymerizable compound by heating. The thermal initiator is exemplified by thermal cationic polymerization initiators that generate a cationic species by heating and thereby initiate polymerization. Each of different thermal initiators may be used alone or in combination.

The thermal cationic polymerization initiators are exemplified by aryldiazonium salts, aryliodonium salts, arylsulfonium salts, and allene-ion complexes. The thermal cationic polymerization initiators usable herein are also exemplified by compounds of a silanol (e.g., triphenylsilanol) with a chelate compound between a metal (e.g., aluminum or titanium) and one of acetoacetic acid and a diketone; and compounds of a phenol (e.g., bisphenol-S) with a chelate compound between a metal (e.g., aluminum or titanium) and one of acetoacetic acid and a diketone. The thermal cationic polymerization initiators usable herein are further exemplified by commercial products available typically under the trade names of PP-33, CP-66, and CP-77 (each from ADEKA CORPORATION); the trade name of FC-509 (from 3M Company); the trade name of UVE1014 (General Electric Company); the trade names of San-Aid SI-60L, San-Aid SI-80L, San-Aid SI-100L, San-Aid SI-110L, and San-Aid SI-150L (each from SANSHIN CHEMICAL INDUSTRY CO., LTD.); and the trade name of CG-24-61 (Ciba Japan K.K.).

The use of the thermal initiator (in combination with the component (C)) enables a curing reaction to further proceed by a heat treatment (annealing) and is effective typically when it is difficult to proceed the curing reaction sufficiently by photoirradiation alone. The use is particularly effective upon the formation of a relatively thick cured product, namely, in the case where it is difficult to irradiate the entire photosensitive resin composition with light efficiently. Preferred conditions for the heat treatment will be described later.

The photosensitive resin composition according to the present invention may include the thermal initiator in a content (amount) not critical, but preferably 0.001 to 10 parts by weight, more preferably 0.01 to 5 parts by weight, and furthermore preferably 0.1 to 3 parts by weight, per 100 parts by weight of the total amount of the component (A) in the photosensitive resin composition. The photosensitive resin composition, when including the thermal initiator in a content less than 0.001 part by weight, may readily cause curing failure particularly upon the formation of a relatively thick cured product. In contrast, the photosensitive resin composition, if including the thermal initiator in a content greater than 10 parts by weight, may cause the cured product to have inferior properties such as heat resistance or may be disadvantageous in cost. The total amount of two or more thermal initiators upon combination use is preferably controlled within the range.

Antioxidant

The photosensitive resin composition according to the present invention may further include one or more antioxidants in addition to the above-mentioned components. The antioxidants for use herein may be any of known or customary antioxidants not limited, but are exemplified by phenolic, phosphorus, and sulfur antioxidants. Each of different antioxidants may be used alone or in combination.

The phenolic antioxidants are exemplified by monophenols such as 2,6-di-t-butyl-p-cresol, butylated hydroxyanisoles, 2,6-di-t-butyl-p-ethylphenol, and stearyl β-(3,5-di-t-butyl-4-hydroxyphenyl)propionate; bisphenols such as 2,2'-methylenebis(4-methyl-6-t-butylphenol), 2,2'-methylenebis(4-ethyl-6-t-butylphenol), 4,4'-thiobis(3-methyl-6-t-butylphenol), 4,4'-butylidenebis(3-methyl-6-t-butylphenol), and 3,9-bis[1,1-dimethyl-2-{β-(3-t-butyl-4-hydroxy-5-methylphenyl)propionyloxy}ethyl]-2,4,8,10-tetraoxaspiro[5.5]undecane; and high-molecular-weight phenols such as 1,1,3-tris(2-methyl-4-hydroxy-5-t-butylphenyl)butane, 1,3,5-trimethyl-2,4,6-tris(3,5-di-t-butyl-4-hydroxybenzyl)benzene, tetrakis-[methylene-3-(3',5'-di-t-butyl-4'-hydroxyphenyl) propionate]methane, bis[3,3'-bis-(4'-hydroxy-3'-t-butylphenyl)butyric acid] glycol ester, 1,3,5-tris(3',5'-di-t-butyl-4'-hydroxybenzyl)-s-triazine-2,4,6-(1H,3H,5H)trione, and tocophenols.

The phosphorus antioxidants are exemplified by phosphites such as triphenyl phosphite, diphenyl isodecyl phosphite, phenyl diisodecyl phosphite, tris(nonylphenyl)phosphite, diisodecyl pentaerythritol phosphite, tris(2,4-di-t-butylphenyl)phosphite, cyclic neopentanetetrayl bis(octadecyl)phosphite, cyclic neopentanetetrayl bis(2,4-di-t-butylphenyl) phosphite, cyclic neopentanetetrayl bis(2,4-di-t-butyl-4-methylphenyl)phosphite, and bis[2-t-butyl-6-methyl-4-{2-(octadecyloxycarbonyl)ethyl}phenyl]hydrogenphosphite; and oxaphosphaphenanthrene oxides such as 9,10-dihydro-9-oxa-10-phosphaphenanthrene-10-oxide and 10-(3,5-di-t-butyl-4-hydroxybenzyl)-9,10-dihydro-9-oxa-10-phosphaphenanthrene-10-oxide.

The sulfur antioxidants are exemplified by dilauryl 3,3'-thiodipropionate, dimyristyl 3,3'-thiodipropionate, and distearyl 3,3'-thiodipropionate.

The photosensitive resin composition according to the present invention may include the antioxidant in a content (amount) not critical, but preferably 0.001 to 15 parts by weight, more preferably 0.01 to 10 parts by weight, and furthermore preferably 0.1 to 5 parts by weight, per 100 parts by weight of the total amount of the component (A) in the photosensitive resin composition. The photosensitive resin composition, if including the antioxidant in a content less than 0.001 part by weight, may undergo insufficient suppression of deteriorations such as oxidation in some applications. In contrast, the photosensitive resin composition, if including the antioxidant in a content greater than 15 parts by weight, may cause the cured product to have inferior properties such as heat resistance or cause a disadvantage in cost. The total amount of two or more antioxidants upon combination use is preferably controlled within the range.

In addition to the aforementioned components, the photosensitive resin composition according to the present invention may further include any of additional components within ranges not adversely affecting advantageous effects of the present invention. The additional components are exemplified by hydroxyl-containing compounds having a molecular weight less than 500 (e.g., diethylene glycol), antifoaming agents, leveling agents, coupling agents (e.g., silane coupling agents), surfactants, inorganic fillers, flame retardants, ultraviolet absorbers, ion adsorbents, phosphors, mold-release agents, pigment-dispersing agents, dispersing aids, and other customary additives.

The photosensitive resin composition may include one or more of such additional components in a content of about 10 percent by weight or less based on the total amount (100 percent by weight) of the photosensitive resin composition.

The "content" refers to a total content upon combination use of two or more additional components.

The photosensitive resin composition according to the present invention may be prepared typically by mixing and stirring the components (A), (C), and (D) (more preferably the components (A), (B), (C), and (D)) optionally with one or more other components in predetermined proportions; and debubbling (degassing) the mixture in vacuo according to necessity. For better dispersibility of the component (D) (particularly, a pigment), the material components may be subjected to a dispersion treatment by a known process such as a dispersing process using a ball mill, sand mill, bead mill, three-roll mill, paint shaker, ultrasonic application, or air bubble homogenizer.

The photosensitive resin composition according to the present invention may have a viscosity at 25° C. of not critical, but preferably 100 to 100000 mPa·s, more preferably 500 to 10000 mPa·s, and furthermore preferably 1000 to 8000 mPa·s. The photosensitive resin composition, if having a viscosity out of the range, may be difficult to handle and give a cured product (e.g., a light-shielding film) with insufficient productivity. The viscosity at 25° C. may be measured typically with a rheometer (trade name Physica UDS-200, Anton Paar GmbH) and a cone-plate (with a cone diameter of 16 mm and a taper angle of 0 degree) at a temperature of 25° C. and a number of revolutions of 20 rpm.

Cured Product

The photosensitive resin composition according to the present invention can form a cured product upon photoirradiation to allow the cationic polymerization reaction of the component (A) in the photosensitive resin composition to proceed. When the photosensitive resin composition further includes the component (B), the photoirradiation further allows the reaction between the component (A) and the component (B) to proceed. Light (active energy ray) for use herein to allow the polymerization reaction to proceed is not limited and can be any of, for example, infrared rays, visible light, ultraviolet rays, X-rays, electron beams, alpha rays, beta rays, and gamma rays. Among them, ultraviolet rays are preferred for excellent handleability.

Photoirradiation conditions to form the cured product can be appropriately adjusted according typically to the type and energy of light to be applied, and the shape and size of the cured product to be formed. Typically, the irradiation with an ultraviolet ray may be performed at an irradiation intensity of typically preferably about 0.1 to about 1000 mW/cm$^2$, and more preferably 1 to 500 mW/cm$^2$ for an irradiation time of typically about 1 to about 120 seconds, and preferably 3 to 60 seconds. The photoirradiation may employ, for example, any of high-pressure mercury lamps, ultra-high-pressure mercury lamps, xenon lamps, carbon arc, metal halide lamps, sunlight, LED lamps, and laser.

The photosensitive resin composition according to the present invention has the configuration and can thereby be rapidly cured with excellent curability at a very high curing rate by photoirradiation even when including the component (D) in such an amount as to impart sufficient light-shielding ability thereto. The photosensitive resin composition can form a cured product excellent in light-shielding ability and adhesiveness. The photosensitive resin composition provides a high initial adhesive strength and offers an adhesive strength (to a glass plate) of typically 1 MPa or more, and preferably 5 MPa or more upon irradiation with an ultraviolet ray at 200 mW/cm$^2$ for 15 seconds.

In an embodiment, the photosensitive resin composition according to the present invention further includes the thermal initiator. The curing reaction of this photosensitive resin composition can be further accelerated by a heat treatment (annealing). The heat treatment can be performed at any time such as after the photoirradiation or simultaneously with the photoirradiation. The heat treatment conditions are not critical and appropriately adjustable according typically to the shape and size of the cured article to be formed. In a preferred embodiment, the heat treatment may be performed at a heating temperature of preferably 40° C. to 250° C., and more preferably 60° C. to 200° C., for a heating time of preferably 1 to 480 minutes, and more preferably 3 to 120 minutes. The heating temperature in the heat treatment may be constant or be varied continuously or stepwise.

The cured product of the photosensitive resin composition according to the present invention has high light-shielding ability. The cured product, typically when formed to a thickness of 20 μm, has a light-shielding rate of typically preferably 85% or more, more preferably 90% or more, particularly preferably 95% or more, and most preferably 96% or more. The light-shielding rate may be measured by preparing a 20-μm thick cured product as a test specimen; measuring the total luminous transmittance of the test specimen according to Japanese Industrial Standard (JIS) K7105 (1981), except for using a $D_{65}$ illuminant as a light source; and calculating the light-shielding rate according to the expression:

Light-shielding rate [%]=100 [%]−(Total luminous transmittance [%])

The cured product, typically when formed to a thickness of 10 μm, has a total luminous transmittance of preferably 1.5% or less (e.g., 0% to 1.5%), more preferably 1.0% or less, and furthermore preferably 0.5% or less. The total luminous transmittance may be measured typically by forming a 10-μm thick layer of cured product (light-shielding film) on a glass plate to give a test specimen; and measuring the total luminous transmittance of the test specimen according to JIS K7105 (1981), except for using the $D_{65}$ illuminant as a light source.

The cured product may have a glass transition temperature (Tg) not critical, but preferably 70° C. or higher (e.g., 70° C. to 250° C.), more preferably 80° C. or higher, furthermore preferably 90° C. or higher, and particularly preferably higher than 100° C. The cured product may have a glass transition temperature of 130° C. or higher in some applications. The cured product, if having a glass transition temperature lower than 70° C., may offer insufficient durability (heat resistance) in some applications. The glass transition temperature of the cured product may be measured typically as a tan δ (loss tangent) peak top temperature in a dynamic viscoelastic measurement (dynamic mechanical analysis; DMA) according to JIS K7244-1 to -7. The measurement may be performed typically at a rate of temperature rise of 5° C./rain. The glass transition temperature of the cured product may be controlled typically by compositions of curable component(s) (the component (A), optionally in combination with the component (B)).

The cured product may have a storage elastic modulus at 25° C. not critical, but preferably 0.1 to 10 GPa, more preferably 1 to 5 GPa, and particularly preferably greater than (higher than) 1.5 GPa. The cured product, if having a storage elastic modulus at 25° C. of less than 0.1 GPa, may offer insufficient durability in some applications. In contrast, the cured product, if having a storage elastic modulus at 25° C. of greater than 10 GPa, may offer insufficient flexibility in some applications. The storage elastic modulus of the cured product may be measured typically by a dynamic mechanical analysis (DMA) according to JIS K7244-1 to -7. The measurement may be performed typically at a rate of temperature rise of 5° C./min. The storage elastic modulus of the cured product may be controlled typically by the composition of curable components (the component (A), optionally in combination with the component (B)).

For example, the photosensitive resin composition according to the present invention can be cured rapidly to form a light-shielding film or light-shielding layer upon application to a predetermined position of an optical component and subsequent photoirradiation. The photosensitive resin composition can be applied by a known or customary technique such as dispensing or transfer printing (gravure printing). The light-shielding film or light-shielding layer may have any shape appropriately choosable.

In addition to the formation of the light-shielding film or light-shielding layer, the photosensitive resin composition according to the present invention is also usable in other applications such as printing inks, ink-jet inks, materials for photomask production, materials for proof printing production, etching resists, solder resists (solder masks), plasma display panel barrier ribs, dielectric patterns, electrode (conductor circuit) patterns, electronic component circuit patterns, electroconductive pastes, electroconductive films, and lamination of a camera cabinet with a substrate (e.g., an interposer).

The photosensitive resin composition according to the present invention can form a cured product rapidly, inexpensively, and easily by photoirradiation, where the cured product has high light-shielding ability. Assume that the photosensitive resin composition according to the present invention is used as an adhesive, applied to between lenses constituting an imaging unit of an electronic appliance, and irradiated with light. The photosensitive resin composition in this case can rapidly bond and fix the lenses with each other and simultaneously form a light-shielding layer between the lenses. Alternatively, it is also acceptable that the photosensitive resin composition according to the present invention is used to form a light-shielding film, and the resulting light-shielding film is applied between lenses with an adhesive, where the lenses constitute an imaging unit. In addition, the cured product (e.g., light-shielding film or light-shielding layer) obtained by curing the photosensitive resin composition according to the present invention has reflow heat resistance and can be mounted typically onto a circuit board by solder reflow. This contributes to shorter working processes, dramatically better productivity, and further thinning of the imaging unit.

Optical Component

An optical component according to an embodiment of the present invention includes a cured product formed from the photosensitive resin composition according to the present invention. The optical component can exhibit excellent quality, because the cured product, formed typically as a light-shielding film or light-shielding layer, has high light-shielding ability.

The cured product (e.g., light-shielding film or light-shielding layer) in the optical component may have a thickness of typically about 50 μm or less, while the thickness can be appropriately selected according typically to the type, size, shape, and other factors of the optical component. The cured product according to the present invention is formed from the photosensitive resin composition. The cured product, even when having a relatively large thickness, resists the occurrence of disadvantages caused by curing failure of the photosensitive resin composition. The disadvantages are exemplified by adhesive strength reduction, heat resistance deterioration, and surface tack occurrence. The "relatively large thickness" refers to a thickness of typically larger than 100 μm, more specifically 300 μm or more, and particularly 500 μm or more.

The optical component is exemplified by known or customary optical components including lenses; solid-state image sensing devices such as CCD image sensors and CMOS image sensors; touch-screen panels; liquid crystal displays; plasma display panels; LED packages; and various electronic components. Such optical components may be typically applied to the fields of portable electronic appliances such as cellular phones and smartphones. Assume that the cured product according to the present invention is included in the optical component as a light-shielding film or light-shielding layer. The light-shielding film or light-shielding layer in this case may be present typically as at least one light-shielding region selected from a region between lenses (a region other than the lenses) or a part of a lens; a region in a black matrix between and around color patterns in color filters; and a region in an LED package.

EXAMPLES

The present invention will be illustrated in further detail with reference to several examples below. It should be noted, however, that the examples are by no means intended to limit the scope of the invention.

Examples 1 to 10 and Comparative Examples 1 and 2

Components were combined according to formulations (in part by weight) given in Table 1, stirred and mixed in a planetary centrifugal mixer, and yielded homogeneous photosensitive resin compositions (light-shielding compositions). The components included a cationically polymerizable compound, a light-shielding material, a photo-cationic polymerization initiator, a thermal cationic polymerization initiator, and an antioxidant. The resulting photosensitive resin compositions were subjected to measurements and evaluations by methods as follows. The results of measurements and evaluations are indicated in "Evaluation results" in Table 1.

(1-1) Light-Shielding Ability Evaluation

Each of the above-obtained photosensitive resin compositions according to Examples 1 to 10 and Comparative Examples 1 and 2 was applied onto a piece of glass to a thickness of 10 μm using an applicator. Next, the applied photosensitive resin compositions were irradiated with an ultraviolet ray using an ultraviolet irradiator (UV or UV-LED irradiator) and yielded cured products (cured resins). The irradiation was performed at an irradiation intensity of 10 to 50 mW/cm$^2$ and an integrated irradiance (integrated light quantity) as given in Table 1. In Examples 7 and 8, cured products were prepared by further performing annealing under conditions given in Table 1 after the ultraviolet irradiation.

The above-obtained laminates of the glass and the cured product, as light-shielding ability evaluation samples, were subjected to a total luminous transmittance measurement, based on which a light-shielding rate was determined according to the expression:

Light-shielding rate [%]=100 [%]–(Total luminous transmittance [%])

The total luminous transmittance was measured with a turbidimeter (trade name NDH2000, Nippon Denshoku Industries Co., Ltd.).

(1-2) Adhesiveness Evaluation

Initially, there was prepared a Teflon® sheet having outer dimensions of 45 mm high by 55 mm wide and a thickness of 100 μm or 500 μm corresponding to the thickness of an adhesiveness evaluation sample given in Table 1. The inside of the sheet was cut out in a U-shape with an opening corresponding to the height side and yielded a spacer (Teflon® sheet spacer) having inner dimensions of 40 mm high by 50 mm wide. Next, two glass plates having outer dimensions of 45 mm high by 55 mm wide and a thickness of 1 mm were arranged so as to sandwich the spacer. The photosensitive resin compositions obtained according to Examples 1 to 10 and Comparative Examples 1 and 2 were each poured and charged into space between the two glass plates. The charged photosensitive resin compositions were irradiated with an ultraviolet ray using an ultraviolet irradiator (UV or UV-LED irradiator) to be cured, and yielded adhesiveness evaluation samples. The irradiation was performed at an irradiation intensity of 10 to 50 mW/cm² and an integrated irradiance (integrated light quantity) as given in Table 1. In Examples 7 and 8, adhesiveness evaluation samples were prepared by further performing annealing under conditions given in Table 1 after the ultraviolet irradiation.

On the adhesiveness evaluation samples, a bond strength (adhesive strength) (MPa) of the cured product of the photosensitive resin composition with respect to the glass plates in a shearing direction was measured with the TENSILON RTF-1350 (A&D Co., Ltd.). Each cured product had a thickness of 100 μm or 500 μm, as given in Table 1.

When a sample offered a high adhesive strength and underwent glass plate rupture upon the measurement, the adhesive strength thereof is indicated as ">15" (namely, a value greater than 15 MPa) in Table 1.

(1-3) Glass Transition Temperature and Storage Elastic Modulus Measurements

Initially there was prepared a glass mold capable of giving a 500-μm thick molded article after applying a mold-release agent thereto by vapor deposition. The photosensitive resin compositions obtained according to Examples 1 to 10 and Comparative Examples 1 and 2 were each cast into the prepared glass mold. Next, the cast photosensitive resin compositions were irradiated with an ultraviolet ray using an ultraviolet irradiator (UV or UV-LED irradiator) and yielded cured products. The irradiation was performed at an irradiation intensity of 10 to 50 mW/cm² and an integrated irradiance (integrated light quantity) as given in Table 1. In Examples 7 and 8, the cured products were prepared by further performing annealing under conditions given in Table 1 after the ultraviolet irradiation. The prepared cured products could be easily removed from the glass mold.

Of the cured products, the cured products derived from the photosensitive resin compositions obtained in Examples 6 to 8 were subjected to the measurement of a storage elastic modulus at 25° C. by a dynamic mechanical analysis method according to JIS K7244-4 Part 4: Tensile vibration-Non-resonance method. Measurement conditions are as follows:

Measurement Conditions

Measuring device: solid viscoelastic analyzer (RSA-III; TA Instruments)

Atmosphere: nitrogen

Temperature range: −30° C. to 250° C.

Temperature rise: 5° C./min.

In addition, the peak top temperature of loss tangent (tan δ) in the dynamic mechanical analysis (DMA) was determined as a glass transition temperature (Tg) of the sample cured product.

(1-4) Surface Tackiness Evaluation

The photosensitive resin compositions obtained in Examples 1 to 10 and Comparative Examples 1 and 2 were each applied onto a piece of glass (first glass) to a thickness of 10 μm using an applicator. Next, the applied photosensitive resin compositions were irradiated with an ultraviolet ray using an ultraviolet irradiator (UV or UV-LED irradiator) and yielded cured products. The irradiation was performed at an irradiation intensity of 10 to 50 mW/cm² and an integrated irradiance (integrated light quantity) as given in Table 1.

Another piece of glass (second glass) was applied to the cured product surface of each of the resulting laminates of the glass (first glass) and the cured product and then peeled off. In this process, whether or not surface tack (tack of the cured product surface) occurred was qualitatively evaluated by tackiness (tacky feel) felt upon peeling off of the second glass.

TABLE 1

| | | | Example 1 | Example 2 | Example 3 | Example 4 | Example 5 | Example 6 |
|---|---|---|---|---|---|---|---|---|
| Photosensitive resin composition | Cationically polymerizable compound | EHPE3150 | 20 | 20 | 20 | 20 | 20 | 20 |
| | | YX8000 | 20 | 20 | 20 | 20 | 20 | 20 |
| | | (3,3',4,4'-Diepoxy)bicyclohexyl | 40 | 40 | 40 | 40 | 40 | 40 |
| | | CEL2021P | — | — | — | — | — | — |
| | | OXT221 | 20 | 20 | 20 | 20 | 20 | 20 |
| | Light-shielding material | Carbon Black | 2.5 | 5 | 7.5 | 10 | 10 | 10 |
| | Photo-cationic polymerization initiator | LW-S1 | 2 | 2 | 2 | 2 | — | 2 |
| | | LY-1 | — | — | — | — | 4 | — |
| | | c-2 | — | — | — | — | — | — |
| | Thermal cationic polymerization initiator | SI-60L | — | — | — | — | — | — |
| | Antioxidant | IRGANOX1010 | 0.5 | 0.5 | 0.5 | 0.5 | 0.5 | 0.5 |
| | | HP-10 | 0.5 | 0.5 | 0.5 | 0.5 | 0.5 | 0.5 |

TABLE 1-continued

| Cured product | Curing conditions | Integrated ultraviolet quantity (mJ/cm$^2$) | 2500-3000 | 3500-4000 | 4500-5000 | 5500-6000 | 8000-8500 | 5500-6000 |
|---|---|---|---|---|---|---|---|---|
| | | With/without annealing (annealing condition) | without | without | without | without | without | without |
| Evaluation results | | Adhesiveness evaluation sample thickness (μm) | 100 | 100 | 100 | 100 | 100 | 500 |
| | | Surface tackiness evaluation (presence/absence of surface tack) | absence | absence | absence | absence | absence | absence |
| | | Light-shielding rate (%) | 99.3 | 99.6 | 99.8 | >99.9 | >99.9 | >99.9 |
| | | Adhesive strength (MPa) | >15 | >15 | 12.5 | 12.8 | 7.5 | 2.5 |
| | | Tg (° C.) [DMA] | — | — | — | — | — | 100 |
| | | Storage elastic modulus (GPa) [25° C.] | — | — | — | — | — | 1.5 |

| | | | Example 7 | Example 8 | Example 9 | Example 10 | Com. Ex. 1 | Com. Ex. 2 |
|---|---|---|---|---|---|---|---|---|
| Photosensitive resin composition | Cationically polymerizable compound | EHPE3150 | 20 | 20 | 20 | 20 | 20 | 20 |
| | | YX8000 | 20 | 20 | 20 | 20 | 65 | 20 |
| | | (3,3',4,4'-Diepoxy)bicyclohexyl | 40 | 40 | 30 | 40 | — | — |
| | | CEL2021P | — | — | 10 | — | — | 40 |
| | | OXT221 | 20 | 20 | 20 | 20 | 15 | 20 |
| | Light-shielding material | Carbon Black | 10 | 10 | 2.5 | 10 | 10 | 10 |
| | Photo-cationic polymerization initiator | LW-S1 | 2 | 2 | 2 | — | 2 | 2 |
| | | LY-1 | — | — | — | — | — | — |
| | | c-2 | — | — | — | 4 | — | — |
| | Thermal cationic polymerization initiator | SI-60L | 0.5 | 0.5 | — | — | — | — |
| | Antioxidant | IRGANOX1010 | 0.5 | 0.5 | 0.5 | 0.5 | 0.5 | 0.5 |
| | | HP-10 | 0.5 | 0.5 | 0.5 | 0.5 | 0.5 | 0.5 |
| Cured product | Curing conditions | Integrated ultraviolet quantity (mJ/cm$^2$) | 5500-6000 | 5500-6000 | 2500-3000 | 8000-8500 | 5500-6000 | 5500-6000 |
| | | With/without annealing (annealing condition) | with (80° C. for 30 min) | with (150° C. for 5 min) | without | without | without | without |
| Evaluation results | | Adhesiveness evaluation sample thickness (μm) | 500 | 500 | 100 | 100 | 100 | 100 |
| | | Surface tackiness evaluation (presence/absence of surface tack) | absence | absence | absence | absence | presence | presence |
| | | Light-shielding rate (%) | >99.9 | >99.9 | 99.3 | >99.9 | >99.9 | >99.9 |
| | | Adhesive strength (MPa) | >15 | >15 | >15 | 12.5 | 1.5 | 6.5 |
| | | Tg (° C.) [DMA] | 140 | 180 | — | — | — | — |
| | | Storage elastic modulus (GPa) [25° C.] | 2.1 | 2.2 | — | — | — | — |

As is seen from above, the photosensitive resin compositions obtained in Examples 1 to 10 met the conditions specified in the present invention. These photosensitive resin compositions had desired light-shielding ability, still exhibited excellent curability (were cured rapidly) upon ultraviolet irradiation, and gave cured products (light-shielding films) devoid of surface tack. The cured products developed sufficient adhesiveness. The photosensitive resin compositions according to Examples 7 and 8 each further employed a thermal cationic polymerization initiator as a polymerization initiator to form cured products having a thickness of about 500 μm. This effectively allowed the resulting cured products to have better adhesiveness.

Examples 11 to 16

Components were combined according to formulations (in part by weight) given in Table 2, stirred and mixed in a planetary centrifugal mixer, and yielded homogeneous photosensitive resin compositions.

The resulting photosensitive resin compositions were evaluated on light-shielding ability, initial adhesiveness, and reflow heat resistance by methods as follows. The evaluation results are synthetically indicated in Table 2 below.

(2-1) Light-Shielding Ability Evaluation

The photosensitive resin compositions obtained in Examples 11 to 16 were each applied onto a piece of glass using an applicator and covered with another piece of glass. Next, the applied photosensitive resin compositions were irradiated with an ultraviolet ray using an ultraviolet irradiator (UV or UV-LED irradiator) and yielded laminates of [glass/(cured product)/glass], where the cured product had a thickness of 20 μm. The irradiation was performed at an intensity of 200 mW/cm$^2$ for 15 seconds.

The total luminous transmittance of each of the laminates of [glass/(cured product)/glass] as samples was measured, from which a light-shielding rate was calculated according to the expression:

Light-shielding rate [%]=100 [%]−(Total luminous transmittance [%])

The total luminous transmittance was measured with a turbidimeter (trade name NDH2000, Nippon Denshoku Industries Co., Ltd., using a $D_{65}$ illuminant as a light source).

(2-2) Initial Adhesiveness Evaluation

Initially, there was prepared a Teflon® sheet having outer dimensions of 45 mm high by 55 mm wide and a thickness of 20 μm. The inside of the sheet was cut out in a U-shape with an opening corresponding to the height side and yielded a spacer (Teflon® sheet spacer) having inner dimensions of 40 mm high by 50 mm wide. Next, two glass plates each having outer dimensions of 45 mm high by 55 mm wide and a thickness of 1 mm were arranged so as to sandwich the spacer. The photosensitive resin compositions obtained C (poor reflow heat resistance): Of the total samples, four to less than seven samples suffered from peeling; and D (very poor reflow heat resistance): Of the total samples, seven or more samples suffered from peeling.

TABLE 2

|  |  |  |  | Example 11 | Example 12 | Example 13 | Example 14 | Example 15 | Example 16 |
|---|---|---|---|---|---|---|---|---|---|
| Photosensitive resin composition | Curable component | Cationically polymerizable compound | EHPE3150 | 20 | — | — | — | 20 | 20 |
|  |  |  | (3,3',4,4'-Diepoxy)bicyclohexyl | 45 | 45 | 45 | 45 | 45 | 45 |
|  |  |  | YX8000 | — | — | — | — | — | 20 |
|  |  |  | OXT221 | 15 | 15 | 15 | 15 | 15 | 15 |
|  |  | Hydroxyl-containing compound | OD220PL | 20 | 20 | 20 | 20 | — | — |
|  |  |  | PB3600 | — | 20 | 20 | 20 | 20 | — |
|  | Photo-cationic polymerization initiator |  | c-1 | 10 | 10 | 10 | — | 10 | 10 |
|  |  |  | c-2 | — | — | — | 10 | — | — |
|  | Light-shielding material |  | Carbon black | 5 | 5 | 10 | 10 | 5 | 5 |
| Cured product | UV irradiation time (sec) |  |  | 15 | 15 | 15 | 15 | 15 | 15 |
|  | Thickness (μm) |  |  | 20 | 20 | 20 | 20 | 20 | 20 |
| Evaluation results | Light-shielding rate (%) |  |  | 95.2 | 96.1 | 99.6 | 99.7 | 99.5 | 95.5 |
|  | Initial adhesive strength (MPa) |  |  | >15 | >15 | >15 | 7.7 | 8.0 | >15 |
|  | Reflow heat resistance |  |  | B | A | A | A | B | D | according to Examples 11 to 16 were each poured and charged into space between the two glass plates. The charged photosensitive resin compositions were irradiated with an ultraviolet ray using an ultraviolet irradiator (UV-LED irradiator) to be cured, and yielded laminates of [(glass plate)/(cured product)/(glass plate)] as samples, where the cured product had a thickness of 20 μm. The irradiation was performed at an intensity of 200 mW/cm² for 15 seconds.

The above-obtained samples were examined to measure a bond strength (adhesive strength) (MPa) between the cured product and the glass plates in a shearing direction with a tensile and compression testing machine (trade name TENSILON RTF-1350, A&D Co., Ltd.), and this was defined as an "initial adhesive strength".

When a sample offered a high adhesive strength and underwent glass plate rupture upon the measurement, the adhesive strength thereof is indicated as ">15" (namely, a value greater than 15 MPa) in Table 2.

(2-3) Reflow Heat Resistance Evaluation

The photosensitive resin compositions obtained in Examples 11 to 16 were each applied onto a piece of glass to a thickness of 20 μm using an applicator and covered with another piece of glass. Next, the applied photosensitive resin compositions were irradiated with an ultraviolet ray using an ultraviolet irradiator (UV-LED irradiator) and yielded laminates of [glass/(cured product)/glass] where the cured product had a thickness of 20 μm. The irradiation was performed at an intensity of 200 mW/cm² for 15 seconds.

The obtained laminates of [glass/(cured product)/glass] as samples (sample number: 20) were subjected to heat resistance tests continuously three times. In one test, each sample was held in an oven preheated at 270° C. in an air atmosphere for one minutes. Whether or not peeling occurred between the glass and the cured product was visually observed, and the reflow heat resistance was evaluated according to criteria as follows:

Criteria:

A (very good reflow heat resistance): Of the total samples, less than two samples suffered from peeling;

B (good reflow heat resistance): Of the total samples, two to less than four samples suffered from peeling;

Components used in the examples and comparative examples are as follows:

Curable Component (Curable Compound)
 Cationically Polymerizable Compound
  EHPE3150: 1,2-Epoxy-4-(2-oxiranyl)cyclohexene adduct of 2,2-bis(hydroxymethyl)-1-butanol, Daicel Corporation (3,3',4,4'-Diepoxy)bicyclohexyl
  YX8000: Hydrogenated glycidyl ether epoxy compound, Mitsubishi Chemical Corporation
  CEL2021P: 3,4-Epoxycyclohexylmethyl (3,4-epoxy)cyclohexanecarboxylate, Daicel Corporation
  OXT221: 3-Ethyl-3-([(3-ethyloxetan-3-yl)methoxy]methyl)oxetane, Toagosei Co., Ltd.
 Hydroxyl-containing Compound
  CD220PL: Polycarbonate diol, with a number-average molecular weight of 2000, trade name PLACCEL CD220PL, Daicel Corporation
  PB3600: Epoxidized polybutadiene, with a number-average molecular weight of 5900, trade name EPOLEAD PB3600, Daicel Corporation
Photo-cationic Polymerization Initiator
 LW-S1: Product of San-Apro Ltd.
 LY-1: Product of San-Apro Ltd.
 c-1: 4-Isopropylphenyl(p-tolyl)iodonium tris(pentafluoroethyl)trifluorophosphate
 c-2: [1,1'-Biphenyl]-4-yl[4-(1,1'-biphenyl)-4-ylthiophenyl]phenyl tris(pentafluoroethyl)trifluorophosphate
Thermal Cationic Polymerization Initiator
 SI-60L (San-Aid SI-60L): Aromatic sulfonium salt, SANSHIN CHEMICAL INDUSTRY CO., LTD.
Antioxidant
 IRGANOX1010: Hindered phenol antioxidant, BASF SE
 HP-10 (ADK STAB HP-10): Phosphorus antioxidant, ADEKA CORPORATION
Light-Shielding Material
 Carbon black: trade name MA100R, Mitsubishi Chemical Corporation, with an average particle diameter of 24 nm.

INDUSTRIAL APPLICABILITY

The photosensitive resin composition according to embodiment of the present invention is particularly preferably used to form a light-shielding film or light-shielding layer in an optical component. The photosensitive resin composition according to the present invention is also usable in various applications such as printing inks, ink-jet inks, materials for photomask production, materials for proof printing production, etching resists, solder resists (solder masks), plasma display panel barrier ribs, dielectric patterns, electrode (conductor circuit) patterns, electronic component circuit patterns, electroconductive pastes, electroconductive films, and lamination of a camera cabinet with a substrate (e.g., an interposer).

The invention claimed is:

1. A photosensitive resin composition comprising following components:
   (A) a cationically polymerizable compound at least comprising a (3,3',4,4'-diepoxy)bicyclohexyl and 3-ethyl-3 ([(3-ethyloxetan-3-yl)methoxy]methyl)oxetane;
   (B) a polycarbonate diol having a molecular weight of 1500 to 100000, and an epoxidized polybutadiene having a molecular weight of 1500 to 100000;
   (C) a photo-cationic polymerization initiator; and
   (D) a carbon black,
   wherein the amount of the component (B) is 5 to 80 percent by weight based on the total amount of the components (A) and (B),
   wherein the amount of the compound containing an alicyclic epoxy group and devoid of ester bonds is 20 to 90 percent by weight based on the total amount of the component (A), and
   wherein the amount of compounds represented by following Formula (a-5) is 12 percent by weight or less based on a total amount of the component (A)

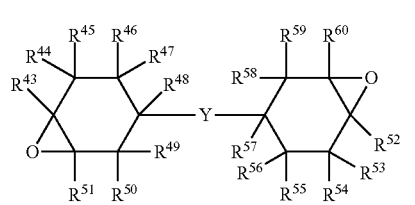

(a-5)

wherein $R^{43}$, $R^{44}$, $R^{45}$, $R^{46}$, $R^{47}$, $R^{48}$, $R^{49}$, $R^{50}$ $R^{51}$, $R^{52}$, $R^{53}$, $R^{54}$, $R^{55}$, $R^{56}$, $R^{57}$, $R^{58}$, $R^{59}$, and $R^6$ are identical or different, and are independently selected from a hydrogen atom, a halogen atom, a hydrocarbon group optionally containing at least one of oxygen and halogen, and an optionally substituted alkoxy group; and Y represents a linkage group containing an ester bond.

2. A photosensitive resin composition comprising following components:
   (A) a cationically polymerizable compound at least comprising a (3,3',4,4'-diepoxy)bicyclohexyl, 3-ethyl-3 ([(3-ethyloxetan-3-yl)methoxy]methyl)oxetane, 1,2-epoxy-4-(2-oxiranyl)cyclohexene adduct of 2,2-bis (hydroxymethyl)-1-butanol, and hydrogenated glycidyl ether epoxy compound;
   (C) a photo-cationic polymerization initiator; and
   (D) a carbon black,
   wherein the amount of compounds represented by following Formula (a-5) is 12 percent by weight or less based on a total amount of the component (A)

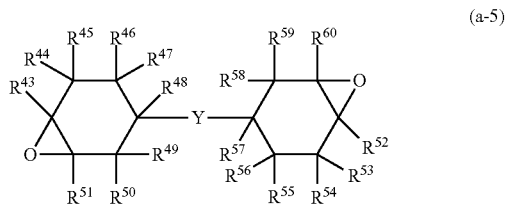

(a-5)

wherein $R^{43}$, $R^{44}$, $R^{45}$, $R^{46}$, $R^{47}$, $R^{48}$, $R^{49}$, $R^{50}$, $R^{51}$, $R^{52}$, $R^{53}$, $R^{54}$, $R^{55}$, $R^{56}$, $R^{57}$, $R^{58}$, $R^{59}$, and $R^{60}$ are identical or different, and are independently selected from a hydrogen atom, a halogen atom, a hydrocarbon group optionally containing at least one of oxygen and halogen, and an optionally substituted alkoxy group; and Y represents a linkage group containing an ester bond.

3. The photosensitive resin composition according to claim 1, wherein the component (C) comprises at least one compound selected from the group consisting of iodonium salt compounds and sulfonium salt compounds.

4. The photosensitive resin composition according to claim 2, wherein the component (C) comprises at least one compound selected from the group consisting of iodonium salt compounds and sulfonium salt compounds.

5. The photosensitive resin composition according to claim 1, wherein the component (C) comprises a photo-cationic polymerization initiator comprising:
   a cationic moiety; and
   an anionic moiety comprising a fluoroalkyl group.

6. The photosensitive resin composition according to claim 2, wherein the component (C) comprises a photo-cationic polymerization initiator comprising:
   a cationic moiety; and
   an anionic moiety comprising a fluoroalkyl group.

7. The photosensitive resin composition according to claim 5, wherein the anionic moiety of the component (C) is a fluoroalkylfluorophosphate ion represented by the formula: $[(Rf)_n PF_{6-n}]^-$
   wherein Rf represents an alkyl group having 1 to 4 carbon atoms, except with fluorine replacing 80% or more of hydrogen of the alkyl group; and n represents an integer from 1 to 5.

8. The photosensitive resin composition according to claim 6, wherein the anionic moiety of the component (C) is a fluoroalkylfluorophosphate ion represented by the formula: $[(Rf)_n PF_{6-n}]^-$
   wherein Rf represents an alkyl group having 1 to 4 carbon atoms, except with fluorine replacing 80% or more of hydrogen of the alkyl group; and n represents an integer from 1 to 5.

9. A cured product of the photosensitive resin composition of claim 1.

10. A cured product of the photosensitive resin composition of claim 2.

11. An optical component comprising the cured product of claim 9.

12. An optical component comprising the cured product of claim 10.

* * * * *